(12) United States Patent
Kubo et al.

(10) Patent No.: US 12,000,034 B2
(45) Date of Patent: Jun. 4, 2024

(54) COATED TOOL

(71) Applicants: KYOCERA CORPORATION, Kyoto (JP); THE UNIVERSITY OF TOKYO, Tokyo (JP)

(72) Inventors: Hayato Kubo, Satsumasendai (JP); Takahito Tanibuchi, Satsumasendai (JP); Yukihiro Shimogaki, Tokyo (JP); Takeshi Momose, Tokyo (JP); Momoko Deura, Tokyo (JP)

(73) Assignees: KYOCERA Corporation, Kyoto (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 17/793,674

(22) PCT Filed: Jan. 18, 2021

(86) PCT No.: PCT/JP2021/001489
§ 371 (c)(1),
(2) Date: Jul. 19, 2022

(87) PCT Pub. No.: WO2021/149642
PCT Pub. Date: Jul. 29, 2021

(65) Prior Publication Data
US 2023/0073338 A1 Mar. 9, 2023

(30) Foreign Application Priority Data
Jan. 20, 2020 (JP) .................................. 2020-006886

(51) Int. Cl.
C23C 14/06 (2006.01)
(52) U.S. Cl.
CPC ................ *C23C 14/0641* (2013.01)

(58) Field of Classification Search
None
See application file for complete search history.

(56) References Cited

U.S. PATENT DOCUMENTS

| | | |
|---|---|---|
| 2012/0128971 A1 | 5/2012 | Shibata |
| 2018/0304376 A1 | 10/2018 | Kawahara |
| 2021/0108306 A1 | 4/2021 | Denis et al. |

FOREIGN PATENT DOCUMENTS

| | | |
|---|---|---|
| CN | 108723404 A | 11/2018 |
| JP | 2013158868 A | 8/2013 |

(Continued)

OTHER PUBLICATIONS

Machine Translation of WO 2011-016488 A1 (Year: 2011).*

*Primary Examiner* — Binh X Tran
*Assistant Examiner* — Bradford M Gates
(74) *Attorney, Agent, or Firm* — VIERING, JENTSCHURA & PARTNER mbB

(57) ABSTRACT

A coated tool in a non-limiting embodiment of the present disclosure includes a base and a coating film located on the base. The coated tool includes a first surface, a second surface adjacent to the first surface, and a cutting edge located on at least a part of a ridge part of the first surface and the second surface. The coating film includes an AlTiN film. The coating film has a first compressive stress $\sigma 11$ in a first direction which is parallel to a surface of the base and intersects with the cutting edge at an angle of 90°, and a second compressive stress $\sigma 22$ in a second direction which intersects with the first direction at an angle of 90°. The first compressive stress $\sigma 11$ is different from the second compressive stress $\sigma 22$.

14 Claims, 2 Drawing Sheets

(56) References Cited

FOREIGN PATENT DOCUMENTS

| JP | 2014159072 A | 9/2014 |
| JP | 2018094669 A | 6/2018 |
| WO | 2011016488 A1 | 2/2011 |
| WO | 2019048507 A1 | 3/2019 |

* cited by examiner

COATED TOOL

CROSS-REFERENCE TO RELATED APPLICATIONS

The present application is a national stage entry according to 35 U.S.C. § 371 of PCT Application No. PCT/JP2021/001489 filed Jan. 18, 2021, which claims priority to Japanese Patent Application No. 2020-006886 filed Jan. 20, 2020, which are entirely incorporated herein by reference.

TECHNICAL FIELD

The present disclosure relates to a coated tool.

BACKGROUND

A surface coated cutting tool discussed in, for example, Japanese Unexamined Patent Publication No. 2013-158868 (Patent Document 1) has been known as a coated tool. A hard coating layer composed of a composite nitride layer of Al and Cr is depositedly formed on a surface of a tool base in the surface coated cutting tool (coated tool) discussed in Patent Document 1. The hard coating layer is depositedly formed by arc ion plating method that is one of physical vapor deposition (PVD) methods. If the composite nitride layer on a flank surface in a predetermined range from an intersecting ridge part of a rake surface and the flank surface is subjected to residual stress measurement by 2D method, a compressive residual stress $\sigma 11$ in a direction parallel to the intersecting ridge part and a compressive residual stress $\sigma 22$ in a direction orthogonal to $\sigma 11$ satisfy a predetermined relationship.

SUMMARY

A coated tool in a non-limiting embodiment of the present disclosure includes a base and a coating film located on the base. The coated tool includes a first surface, a second surface adjacent to the first surface, and a cutting edge located on at least a part of a ridge part of the first surface and the second surface. The coating film includes an AlTiN film. The coating film has a first compressive stress $\sigma 11$ in a first direction which is parallel to a surface of the base and intersects with the cutting edge at an angle of 90°, and a second compressive stress $\sigma 22$ in a second direction which intersects with the first direction at an angle of 90°. The first compressive stress $\sigma 11$ is different from the second compressive stress $\sigma 22$.

DETAILED DESCRIPTION

<Coated Tools>

Figure 1:
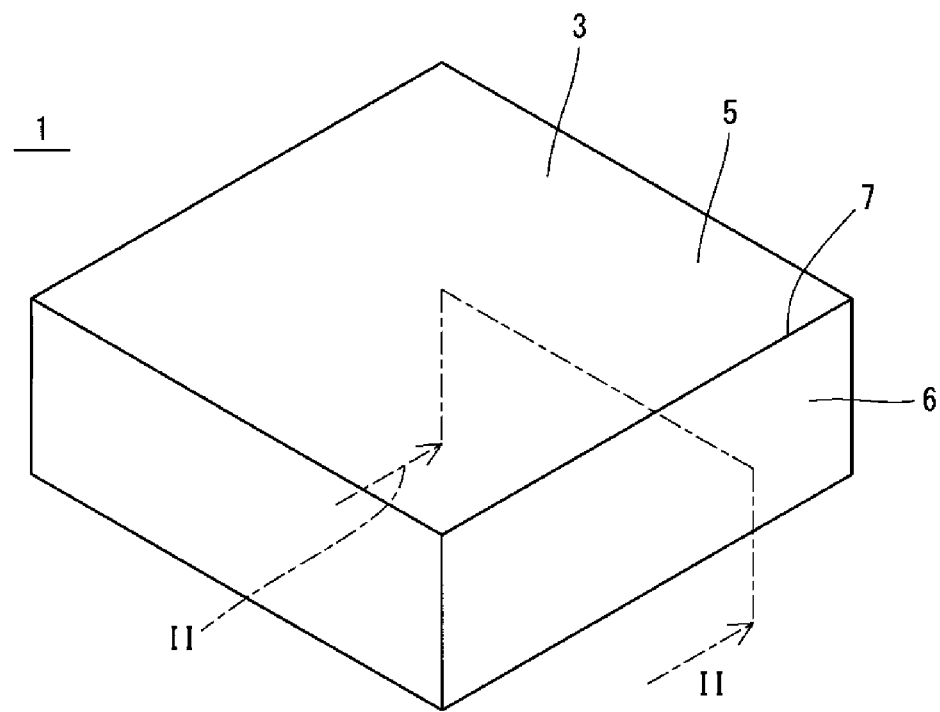
FIG. 1 is a perspective view illustrating a coated tool in a non-limiting embodiment of the present disclosure.

Coated tools in non-limiting embodiments of the present disclosure are described in detail below with reference to the drawings. For the convenience of description, the drawings referred to in the following illustrate, in simplified form, only configurations necessary for describing the embodiments. The coated tools may therefore include any arbitrary configuration not illustrated in the drawings referred to. Dimensions of the configurations in each of the drawings faithfully represent neither dimensions of actual configurations nor dimensional ratios of these configurations.

Figure 2:
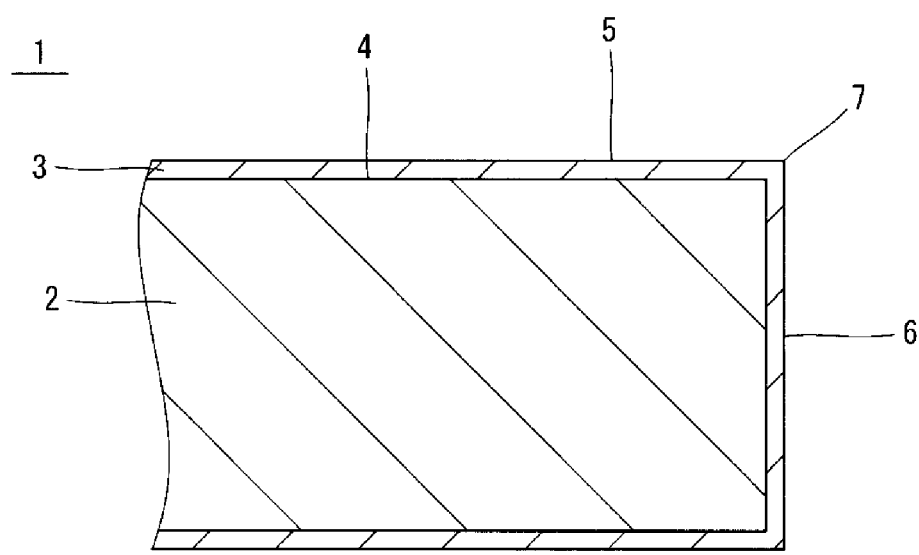
FIG. 2 is an enlarged view of a cross section taken along the line II-II in the coated tool illustrated in FIG. 1.
Figure 3:
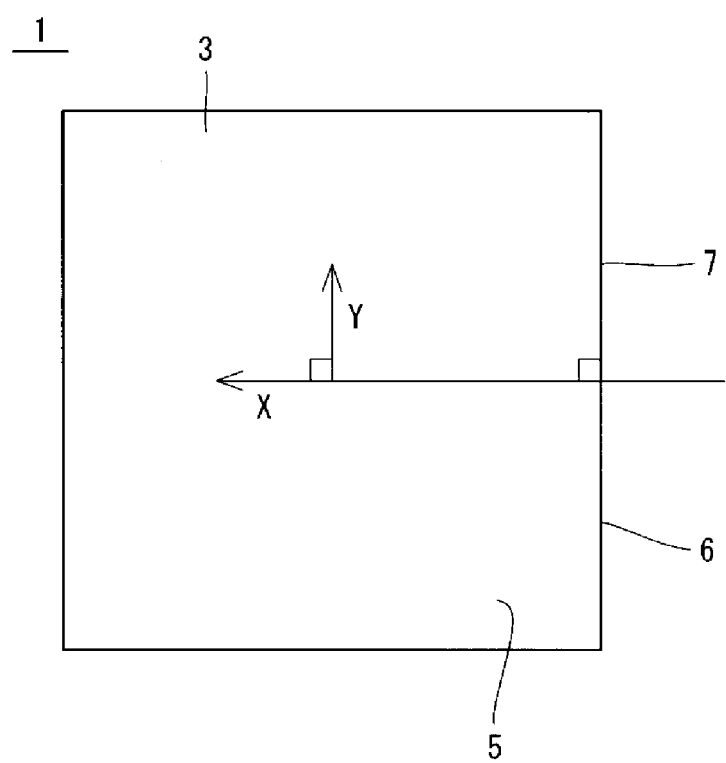
FIG. 3 is a plan view of the coated tool illustrated in FIG. 1.

The coated tool 1 illustrated in FIGS. 1 to 3 is a cutting tool (cutting insert) for use in a cutting process of a workpiece. The coated tool 1 is applicable to, besides cutting tools, wear resistant parts such as sliding parts and metal molds, digging tools, tools such as blades, and impact resistant parts. Applications of the coated tool 1 are not limited to those exemplified above.

The coated tool 1 may include a base 2 and a coating film 3 located on the base 2.

Examples of material of the base 2 may include hard alloys, ceramics and metals. Examples of the hard alloys may include cemented carbides in which a hard phase composed of WC (tungsten carbide) and, if desired, at least one kind selected from the group consisting of carbide, nitride and carbonitride of group 4, group 5 and group 6 metals in the periodic table other than WC is bonded by a binding phase composed of an iron group metal such as Co (cobalt) or Ni (nickel). Other hard alloys may be Ti-based cermets. The ceramics may be, for example, $Si_3N_4$ (silicon nitride), $Al_2O_3$ (aluminum oxide), diamond and cBN (cubic boron nitride). The metals may be, for example, carbon steel, high-speed steel and alloy steel. The material of the base 2 is however not limited to those exemplified above.

The coating film 3 may cover a whole or a part of a surface 4 of the base 2. If the coating film 3 covers only a part of the surface 4 of the base 2, it can be said that the coating film 3 is located on at least the part of the base 2.

The coating film 3 illustrated in FIGS. 1 to 3 may be deposed by chemical vapor deposition (CVD) method. In other words, the coating film 3 illustrated in FIGS. 1 to 3 may be a CVD film.

A thickness of the coating film 3 may be set to, for example, 1-20 μm. The thickness of the coating film 3 is measurable by, for example, cross-section measurement with a Scanning Electron Microscope (SEM) or the like.

The coated tool 1 may include a first surface 5 (upper surface), a second surface 6 (lateral surface) adjacent to the first surface 5, and a cutting edge 7 located on at least a part of a ridge part between the first surface 5 and the second surface 6. The cutting edge 7 may be located on a part or a whole of the ridge part.

The first surface 5 may be a rake surface. A whole or a part of the first surface 5 may be the rake surface. For example, a region extended along the cutting edge 7 in the first surface 5 may be the rake surface.

The second surface 6 may be a flank surface. A whole or a part of the second surface 6 may be the flank surface. For example, a region extended along the cutting edge 7 in the second surface 6 may be the flank surface.

Although the coated tool 1 illustrated in FIG. 1 has a quadrangular plate shape, the shape of the coated tool 1 is not limited thereto. For example, the first surface 5 illustrated in FIG. 1 has a quadrangular shape, but there is no problem if the first surface 5 has a triangular or hexagonal shape instead of the quadrangular shape.

Dimensions of the coated tool 1 are not particularly limited. For example, a length of one side of the first surface 5 in the coated tool 1 illustrated in FIG. 1 is settable to approximately 3-20 mm. A height from the first surface 5 to a surface (lower surface) located on a side opposite to the first surface 5 is settable to approximately 5-20 mm.

The coating film 3 may include an AlTiN (aluminum titanium nitride) film. As in a non-limiting embodiment illustrated in FIGS. 2 and 3, the coating film 3 may have a first compressive stress (compressive residual stress) σ11 in a first direction X which is parallel to the surface 4 of the base 2 and intersects with the cutting edge 7 at an angle of 90°, and a second compressive stress (compressive residual stress) σ22 in a second direction Y which intersects with the first direction X at an angle of 90°. The first compressive stress σ11 may be different from the second compressive stress σ22. The coated tool 1 having these configurations has a long life.

As a method for depositing the coating film, there are, for example, PVD method and CVD method. With the PVD method, magnetic force during deposition is controlled to impart anisotropy to a residual stress of the coating film (refer to, for example, Patent Document 1).

With the CVD method, there is no means for imparting anisotropy to the coating film, and σ11 and σ22 have approximately the same value. Any prior art related to an AlTiN film having anisotropy of residual stress is not yet known.

The first direction X and the second direction Y may be substantially parallel to the surface 4 of the base 2, and may have an error of approximately ±5°. The first direction X may substantially intersect with the cutting edge 7 at an angle of 90°, and may have an error of, for example, approximately ±5°. The second direction Y may substantially intersect with the first direction X at an angle of 90°, and may have an error of, for example, approximately ±5°.

The first compressive stress σ11 may be 0.95 times or less or 1.05 times or more the second compressive stress σ22. If satisfying this configuration, a determination may be made that the first compressive stress σ11 is different from the second compressive stress σ22.

The first compressive stress σ11 may be larger than the second compressive stress σ22. If satisfying this configuration, the coated tool 1 has a longer life. Specifically, crack development can be retarded to improve fracture resistance of the cutting edge 7.

The first compressive stress σ11 may be 200-2000 MPa. The second compressive stress σ22 may be 100-1500 MPa. If satisfying these configurations, the coated tool 1 has a longer life. The first compressive stress σ11 and the second compressive stress σ22 are measurable by, for example, 2D method.

If the AlTiN film is represented by $Al_xTi_{1-x}N$, x may be 0.7 to 0.9. If satisfying this configuration, the coated tool 1 has a longer life. Specifically, the coated tool 1 is excellent in wear resistance and chipping resistance. For example, x is measurable by SEM-EDS.

A thickness of the AlTiN film may be set to, for example, 1-20 μm. The coating film 3 may include any film other than the AlTiN film.

<Method for Manufacturing Coated Tool>

A method for manufacturing a coated tool in a non-limiting embodiment of the present disclosure is described below by exemplifying an embodiment of manufacturing the coated tool 1.

A description is made by exemplifying an embodiment where the base 2 composed of a hard alloy is manufactured as the base 2. Firstly, a mixture may be prepared by suitably adding metal powder, carbon powder or the like to an inorganic powder of metal carbide, nitride, carbonitride, oxide or the like, which are capable of forming the base 2 by sintering, followed by mixing them together. With a known molding method, such as press molding, casting molding, extrusion molding or cold isostatic pressing, the mixture may be molded into a predetermined tool shape. Subsequently, the base 2 composed of the hard alloy may be obtained by sintering an obtained molded body in a vacuum or a non-oxidizing atmosphere. Thereafter, a surface 4 of the base 2 may be subjected to polishing process or honing process.

Subsequently, the coated tool 1 may be obtained by depositing a coating film 3 on the surface 4 of the obtained base 2 by CVD method. Deposition conditions for the coating film 3 including an AlTiN film are for example as follows. A composition of a mixed gas is 0.05-0.5 vol % of $TiCl_4$ (titanium tetrachloride) gas, 0.2-2.0 vol % of $AlCl_3$ (aluminum trichloride) gas, 3-10 vol % of $NH_3$ (ammonia) gas, and the rest, namely, $H_2$ (hydrogen) gas. A deposition temperature is 700-900° C., and a pressure is 1-10 kPa.

It is easy to deposit the coating film 3 having the above configuration by supplying the mixed gas at a specific flow rate (velocity) in a direction intersecting with the cutting edge 7 at approximately right angles or in a direction approximately parallel to the cutting edge 7 during the deposition. If the mixed gas is supplied in the direction intersecting with the cutting edge 7 at the approximately right angles, the velocity may be set to, for example, 5-50 m/s. If the mixed gas is supplied in the direction approximately parallel to the cutting edge 7, the flow rate may be set to 10-100 L/min, and the velocity may be set to, for example, 5-50 m/s. In cases where the word "approximately" is used to express an angle in a sentence, it means that there may be a deviation of approximately ±100.

A region including the cutting edge 7 in the obtained coated tool 1 may be subjected to a polishing process. Consequently, the region including the cutting edge 7 becomes smooth, and the workpiece is therefore less susceptible to welding, thereby improving the fracture resistance of the cutting edge 7.

The present disclosure is described in detail below by illustrating examples, however, the present disclosure is not limited to the following examples.

EXAMPLES

[Samples Nos. 1 to 19]
<Coated Tool Manufacturing>

Firstly, a base was manufactured. Specifically, 6 mass % of metal Co powder having a mean particle diameter of 1.5 μm, 2.0 mass % of TiC (titanium carbide) powder, 0.2 mass % of $Cr_3C_2$ (chromium carbide) powder were added in their respective proportions to WC powder having a mean particle diameter of 1.2 μm, and these were mixed together. A mixture thus obtained was molded into a cutting tool shape (SEEN1203AFTN) by press molding. An obtained molded body was subjected to debinding process and then sintering at 1400° C. in a vacuum of 0.5-100 Pa for one hour, thereby manufacturing a base composed of cemented carbide. Thereafter, a rake surface (first surface) side of the manufactured base was subjected to cutting edge processing (round honing) by brushing process.

Subsequently, a coating film (AlTiN film) having a thickness of 4 μm was deposited on the obtained base by CVD method, thereby obtaining a coated tool presented in Table 1. A thickness of the coating film was a value obtained by cross-section measurement with an SEM.

Deposition conditions were shown below for each composition of the AlTiN film presented in Table 1.

Composition of a mixed gas when depositing Samples Nos. 1 and 17
$Al_{0.65}Ti_{0.35}N$
  $TiCl_4$ gas: 0.35 vol %
  $AlCl_3$ gas: 0.65 vol %
  $NH_3$ gas: 7.0 vol %
  $H_2$ gas: the rest
Composition of a Mixed Gas when Depositing Sample No. 18
$Al_{0.8}Ti_{0.2}N$
  $TiCl_4$ gas: 0.2 vol %
  $AlCl_3$ gas: 0.8 vol %
  $NH_3$ gas: 7.0 vol %
  $H_2$ gas: the rest
Composition of a Mixed Gas when Depositing Samples Nos. 2 to 16
$Al_{0.9}Ti_{0.1}N$
  $TiCl_4$ gas: 0.1 vol %
  $AlCl_3$ gas: 0.9 vol %
  $NH_3$ gas: 7.0 vol %
  $H_2$ gas: the rest
Composition of a Mixed Gas when Depositing Sample No. 19
$Al_{0.95}Ti_{0.05}N$
  $TiCl_4$ gas: 0.05 vol %
  $AlCl_3$ gas: 0.95 vol %
  $NH_3$ gas: 7.0 vol %
  $H_2$ gas: the rest
(Conditions Such as Deposition Temperature, Pressure and Velocity)
Deposition temperature: 730-900° C. (which is abbreviated as "temperature" in Table 1)
Installation angle: 0°, 45°, 90°
Pressure: 5.0 kPa The mixed gas was supplied at the following velocity in a direction intersecting with the cutting edge at approximately right angles in Sample whose installation angle was 90° in Table 1. The mixed gas was supplied at the following velocity in a direction intersecting with the cutting edge at approximately 45° in Sample whose installation angle was 45°.
Velocity: 5 m/s to 50 m/s The mixed gas was supplied at the following flow rate and velocity in a direction approximately parallel to the cutting edge in Sample 5 whose installation angle was 0° in Table 1. A supply velocity of the gas is found from $V=(S/L)\times(T'/P')$, in which V is a velocity, S is a cross-sectional area (m²) of a furnace, L is a flow rate, T' is a deposition temperature (K)/300 K, and P' is a furnace pressure (kPa)/101.325 kPa. The cross-sectional area of the furnace is obtainable from a cross-sectional area of a surface vertical to a gas injection port. If the cross-sectional area of the furnace changes depending on position, a maximum cross-sectional area may be regarded as the cross-sectional area of the furnace.
Flow rate: 10 L/min Velocity: 5 m/s
<Evaluation>

A first compressive stress σ11 and a second compressive stress σ22 were measured, the compositions of the AlTiN films were measured, and an intermittent cutting test was conducted on the obtained coated tools.

Individual measurement methods are as follows, and results are presented in Table 1.

(The First Compressive Stress σ11 and the Second Compressive Stress σ22)

These were measured by 2D method. Residual stress was measured using a peak of an AlTiN (200) plane or AlTiN (111) plane.

(Composition of AlTiN Film)

If represented by $Al_xTi_{1-x}N$, x was measurable by SEM-EDS. Arbitrary five points were measured by SEM-EDS, a ratio of Al was found from an average value of Ti and an average value of Al.

(Intermittent Cutting Test: Dry Milling, Center Cutting Process)
Workpiece: Chromium molybdenum steel (SCM440)
Tool Shape: SEEN1203AFTN
Cutting Speed: 300 m/min
Feed rate: 0.20 mm/rev
Depth of Cut: 2.0 mm
Evaluation Item: Cutting time until reaching the lifetime

TABLE 1

| Sample No. | Installation angle (°) | Velocity (m/s) | Pressure (kPa) | Temperature (° C.) | Compressive stress (MPa) σ11 | σ22 | Composition of AlTiN film | Result of cutting test (min) |
|---|---|---|---|---|---|---|---|---|
| 1 | 45 | 10 | 5 | 800 | 0 | 0 | $Al_{0.65}Ti_{0.35}N$ | 4 |
| 2 | 45 | 10 | 5 | 800 | 500 | 500 | $Al_{0.9}Ti_{0.1}N$ | 20 |
| 3 | 90 | 2 | 5 | 850 | 700 | 700 | $Al_{0.9}Ti_{0.1}N$ | 25 |
| 4 | 90 | 10 | 5 | 800 | 600 | 400 | $Al_{0.9}Ti_{0.1}N$ | 55 |
| 5 | 0 | 5 | 5 | 850 | 700 | 770 | $Al_{0.9}Ti_{0.1}N$ | 45 |
| 6 | 90 | 5 | 5 | 850 | 770 | 700 | $Al_{0.9}Ti_{0.1}N$ | 60 |
| 7 | 90 | 10 | 5 | 850 | 1000 | 700 | $Al_{0.9}Ti_{0.1}N$ | 85 |
| 8 | 90 | 15 | 5 | 850 | 1300 | 700 | $Al_{0.9}Ti_{0.1}N$ | 75 |
| 9 | 90 | 25 | 5 | 850 | 1500 | 700 | $Al_{0.9}Ti_{0.1}N$ | 60 |
| 10 | 90 | 45 | 5 | 850 | 1800 | 700 | $Al_{0.9}Ti_{0.1}N$ | 55 |
| 11 | 90 | 50 | 5 | 850 | 2000 | 700 | $Al_{0.9}Ti_{0.1}N$ | 50 |
| 12 | 90 | 45 | 5 | 800 | 1000 | 400 | $Al_{0.9}Ti_{0.1}N$ | 55 |
| 13 | 90 | 50 | 5 | 800 | 1200 | 400 | $Al_{0.9}Ti_{0.1}N$ | 50 |
| 14 | 90 | 10 | 5 | 750 | 300 | 100 | $Al_{0.9}Ti_{0.1}N$ | 50 |
| 15 | 90 | 10 | 5 | 900 | 1800 | 1500 | $Al_{0.9}Ti_{0.1}N$ | 50 |
| 16 | 90 | 15 | 5 | 890 | 2100 | 1200 | $Al_{0.9}Ti_{0.1}N$ | 45 |
| 17 | 90 | 10 | 5 | 890 | 1000 | 600 | $Al_{0.55}Ti_{0.35}N$ | 45 |
| 18 | 90 | 10 | 5 | 870 | 1000 | 600 | $Al_{0.8}Ti_{0.2}N$ | 65 |
| 19 | 90 | 10 | 5 | 730 | 1000 | 600 | $Al_{0.95}Ti_{0.05}N$ | 45 |

Samples Nos. 1, 2 and 3 in which σ11 is equal to σ22 as presented in Table 1 had a short cutting time until reaching the lifetime. The coated tools of the present disclosure had a long cutting time until reaching the lifetime.

Although the non-limiting embodiments in the present disclosure have been illustrated and described above, the present disclosure is not limited to the foregoing non-limiting embodiments. It is, of course, possible to make any optional ones insofar as they do not depart from the gist of the present disclosure.

DESCRIPTION OF THE REFERENCE NUMERALS 1 coated tool
2 base
3 coating film
4 surface
5 first surface
6 second surface
7 cutting edge
X first direction
Y second direction

What is claimed is:

1. A coated tool, comprising a base and a coating film located on the base,
the coated tool comprising:
   a first surface,
   a second surface adjacent to the first surface, and
   a cutting edge located on at least a part of a ridge part of the first surface and the second surface,
wherein
the coating film comprises an AlTiN film;
the coating film has a first compressive stress $\sigma 11$ in a first direction which is parallel to a surface of the base and intersects with the cutting edge at an angle of 90°, and a second compressive stress $\sigma 22$ in a second direction which intersects with the first direction at an angle of 90°, and
the first compressive stress $\sigma 11$ is different from the second compressive stress $\sigma 22$.

2. The coated tool according to claim 1, wherein the first compressive stress $\sigma 11$ is 1.05 times or more than the second compressive stress $\sigma 22$.

3. The coated tool according to claim 1, wherein the first compressive stress $\sigma 11$ is 200-2000 MPa, and the second compressive stress $\sigma 22$ is 100-1500 MPa.

4. The coated tool according to claim 1, wherein the AlTiN film is represented by $Al_x Ti_{1-x} N$, and x is 0.7 to 0.9.

5. The coated tool according to claim 1, wherein the first surface is a rake surface, and the second surface is a flank surface.

6. A method for making a coated tool, the method comprising:
providing a base of the coated tool, the base comprising:
   a first surface, a second surface adjacent to the first surface, and a cutting edge located on at least a part of a ridge part of the first surface and the second surface; and
forming a coating film using chemical vapor deposition on at least part of the base, the coating film comprising an AlTiN film with a first compressive stress $\sigma 11$ in a first direction which is parallel to a surface of the base and intersects with the cutting edge at an angle of 90°, and a second compressive stress $\sigma 22$ in a second direction which intersects with the first direction at an angle of 90°, wherein the first compressive stress $\sigma 11$ is larger than the second compressive stress $\sigma 22$.

7. The method according to claim 6, wherein the first compressive stress $\sigma 11$ is 1.05 times or more than the second compressive stress $\sigma 22$.

8. The method according to claim 6, wherein
the first compressive stress $\sigma 11$ is 200-2000 MPa, and the second compressive stress $\sigma 22$ is 100-1500 MPa.

9. The method according to claim 6, wherein
the AlTiN film is represented by $Al_x Ti_{1-x} N$, and x is 0.7 to 0.9.

10. The method according to claim 6, wherein
the first surface is a rake surface, and the second surface is a flank surface.

11. The method according to claim 6, wherein
when forming the coating layer using chemical vapor deposition, the coating layer is deposited by supplying a composition of a mixed gas in a direction intersecting with the cutting edge at approximately right angles.

12. The method according to claim 11, wherein
the mixed gas is supplied at a velocity in a range of 5 m/s to 50 m/s.

13. The method according to claim 6, wherein
when forming the coating layer using chemical vapor deposition, the coating layer is deposited by supplying a composition of a mixed gas in a direction approximately parallel to the cutting edge.

14. The method according to claim 13, wherein
the mixed gas is supplied at a velocity in a range of 5 m/s to 50 m/s and a flow rate in a range of 10 L/min. to 100 L/min.

* * * * *

UNITED STATES PATENT AND TRADEMARK OFFICE
CERTIFICATE OF CORRECTION

| | |
|---|---|
| PATENT NO. | : 12,000,034 B2 |
| APPLICATION NO. | : 17/793674 |
| DATED | : June 4, 2024 |
| INVENTOR(S) | : Hayato Kubo et al. |

It is certified that error appears in the above-identified patent and that said Letters Patent is hereby corrected as shown below:

In the Specification

Column 4, Line 30:
Change "deviation of approximately ±100" to --deviation of approximately ±10°--

Signed and Sealed this
Sixteenth Day of July, 2024

Katherine Kelly Vidal
Director of the United States Patent and Trademark Office